United States Patent [19]
Fulford, Jr.

[11] Patent Number: 5,956,591
[45] Date of Patent: Sep. 21, 1999

[54] METHOD OF MAKING NMOS AND PMOS DEVICES HAVING LDD STRUCTURES USING SEPARATE DRIVE-IN STEPS

[75] Inventor: H. Jim Fulford, Jr., Austin, Tex.

[73] Assignee: Advanced Micro Devices, Inc., Sunnyvale, Calif.

[21] Appl. No.: 08/805,539

[22] Filed: Feb. 25, 1997

[51] Int. Cl.$^6$ .................................................. H01L 21/336
[52] U.S. Cl. ...................... 438/305; 438/199; 438/229; 438/230; 438/231; 438/232; 438/275; 438/303; 438/306
[58] Field of Search ............................. 438/199, 229, 438/230, 231, 232, 275, 301, 302, 303, 305, 306, FOR 168, FOR 216, FOR 217, FOR 218

[56] References Cited

U.S. PATENT DOCUMENTS

| | | | |
|---|---|---|---|
| 4,345,366 | 8/1982 | Brower | 29/571 |
| 4,757,026 | 7/1988 | Woo et al. | 437/29 |
| 4,818,714 | 4/1989 | Haskell | 437/44 |
| 4,847,213 | 7/1989 | Pfiester | 437/24 |
| 4,978,626 | 12/1990 | Poon et al. | 437/44 |
| 5,070,029 | 12/1991 | Pfiester et al. | 438/231 |
| 5,169,796 | 12/1992 | Murray et al. | 437/41 |
| 5,439,834 | 8/1995 | Chen | 437/34 |
| 5,455,444 | 10/1995 | Hsue | 257/413 |
| 5,460,993 | 10/1995 | Hsu et al. | 437/44 |
| 5,504,031 | 4/1996 | Hsu et al. | 437/57 |
| 5,610,088 | 3/1997 | Chang et al. | 437/34 |
| 5,614,432 | 3/1997 | Goto | 438/231 |
| 5,618,748 | 4/1997 | Segawa et al. | 438/231 |
| 5,650,341 | 7/1997 | Yang et al. | 437/34 |
| 5,691,225 | 11/1997 | Abiko | 438/199 |
| 5,786,247 | 7/1998 | Chang et al. | 438/231 |

FOREIGN PATENT DOCUMENTS

| | | | |
|---|---|---|---|
| 62-35667 | 2/1987 | Japan . | |
| 402012960 | 1/1990 | Japan | 438/FOR 168 |
| 406209081 | 7/1994 | Japan | 438/FOR 168 |

OTHER PUBLICATIONS

Silicon Processing for the VLSI Era–vol. 3: The Submicron MOSFET, by S. Wolf, published by Lattice Press, Sunset Beach, CA, 1995, pp. 608–611.

*Primary Examiner*—Peter Toby Brown
*Assistant Examiner*—Long Pham
*Attorney, Agent, or Firm*—Skjerven, Morrill, MacPherson, Franklin & Friel, L.L.P.; William W. Holloway

[57] ABSTRACT

A method of making N-channel and P-channel devices using separate drive-in steps is disclosed. The method includes providing a semiconductor substrate with first and second active regions, introducing a first dopant into the first active region to provide all doping for a source and a drain in the first active region, driving-in the first dopant to form the source and the drain in the first active region, introducing a second dopant into the second active region to provide all doping for a source and a drain in the second active region after driving-in the first dopant, and driving-in the second dopant to form the source and the drain in the second active region. Preferably, the first dopant is arsenic or phosphorus, the second dopant is boron, and the first temperature exceeds the second temperature by at least 50° C. In this manner, the boron need not be subjected to the higher first temperature, thereby reducing boron diffusion.

24 Claims, 7 Drawing Sheets

METHOD OF MAKING NMOS AND PMOS DEVICES HAVING LDD STRUCTURES USING SEPARATE DRIVE-IN STEPS

BACKGROUND OF THE INVENTION

1. Field of the Invention

The present invention relates to integrated circuit manufacturing, and more particularly to insulated-gate field-effect transistors.

2. Description of Related Art

An insulated-gate field-effect transistor (IGFET), such as a metal-oxide semiconductor field-effect transistor (MOSFET), uses a gate to control an underlying surface channel joining a source and a drain. The channel, source and drain are located in a semiconductor substrate, with the source and drain being doped oppositely to the substrate. The gate is separated from the semiconductor substrate by a thin insulating layer such as a gate oxide. The operation of the IGFET involves application of an input voltage to the gate, which sets up a transverse electric field in order to modulate the longitudinal conductance of the channel.

In typical IGFET processing, the source and drain are formed by introducing dopants of second conductivity type (P or N) into a semiconductor substrate of first conductivity type (N or P) using a patterned gate as a mask. This self-aligning procedure tends to improve packing density and reduce parasitic overlap capacitances between the gate and the source and drain.

Polysilicon (also called polycrystalline silicon, poly-Si or poly) thin films have many important uses in IGFET technology. One of the key innovations is the use of heavily doped polysilicon in place of aluminum as the gate. Since polysilicon has the same high melting point as a silicon substrate, typically a blanket polysilicon layer is deposited prior to source and drain formation, the polysilicon is anisotropically etched to provide a gate which provides a mask during formation of the source and drain by ion implantation, and then a drive-in step is applied to repair crystalline damage and to drive-in and activate the implanted dopant.

As IGFET dimensions are reduced and the supply voltage remains constant (e.g., 3 V), the electric field in the channel near the drain tends to increase. If the electric field becomes strong enough, it can give rise to so-called hot-carrier effects. For instance, hot electrons can overcome the potential energy barrier between the substrate and the gate insulator thereby causing hot carriers to become injected into the gate insulator. Trapped charge in the gate insulator due to injected hot carriers accumulates over time and can lead to a permanent change in the threshold voltage of the device.

A number of techniques have been utilized to reduce hot carrier effects. One such technique is a lightly doped drain (LDD). The LDD reduces hot carrier effects by reducing the maximum lateral electric field. The drain is typically formed by two ion implants. A light implant is self-aligned to the gate, and a heavy implant is self-aligned to the gate on which sidewall spacers have been formed. The spacers are typically oxides. The purpose of the lighter first dose is to form a lightly doped region of the drain (or LDD) at the edge near the channel. The second heavier dose forms a low resistivity region of the drain, which is subsequently merged with the lightly doped region. Since the heavily doped region is farther away from the channel than a conventional drain structure, the depth of the heavily doped region can be made somewhat greater without adversely affecting the device characteristics.

Complementary metal-oxide semiconductor (CMOS) circuits include N-channel (NMOS) devices and P-channel (PMOS) devices. Conventional processes typically use N-well masks and P-well masks early in the processing sequence to define the NMOS and PMOS regions. Conventional processes also typically include a single masking step for forming the gates for the NMOS and PMOS devices, separate masking steps for implanting lightly doped N-type source/drain regions into the NMOS device and lightly doped P-type source/drain regions into the PMOS device, formation of spacers adjacent to the gates of the NMOS and PMOS devices, and then separate masking steps for implanting heavily doped N-type source/drain regions into the NMOS device and heavily doped P-type source/drain regions into the PMOS device. The N-type dopant used to dope the NMOS source/drain regions is typically arsenic or phosphorus, and P-type dopant used to dope the PMOS source/drain regions is typically boron.

Ion implantation damages the substrate material. During implantation, the dopant ions collide with atoms in the substrate and displace large amounts of such atoms from their lattice sites. In addition, the implanted dopant generally fails to occupy substitutional sites and therefore is not electrically activated. Accordingly, after the dopant is implanted into the source/drain regions, the drive-in step is applied to reduce crystalline damage by annealing the substrate and to activate the dopant by shifing the dopant into substitutional sites. The drive-in step also diffuses the dopant to depths beyond the range of implantation damage. Since present demands for shallow junctions do not allow for extensive dopant redistribution, the drive-in step is usually a rapid thermal anneal.

The diffusion characteristics of various dopants in semiconductor substrates is a complex phenomena which depends, in part, on dopant concentration, substrate (background) doping, junction depth, temperature, and the atmosphere. Unfortunately, at a given high temperature, boron tends to diffuse into the semiconductor substrate at a far greater rate than arsenic or phosphorus. For instance, at 1000° C., boron generally diffuses into silicon at least ten times faster than arsenic or phosphorus. This is partly due to the fact that the activation energy of boron (and consequently the height of the energy barrier that boron must overcome to move within the silicon lattice) is lower than that of arsenic or phosphorus. If, for instance, the gates over the NMOS and PMOS regions have similar lengths, then the effective channel length of the NMOS device may be significantly greater than the effective channel length of the PMOS device due to the rapid diffusion of boron. The problem has been alleviated by implanting the lightly doped source/drain regions for the NMOS and PMOS devices and the heavily doped source/drain regions for the NMOS device, performing a first drive-in step using a first rapid thermal anneal at a first temperature, implanting the heavily doped source/drain regions for the PMOS device, and performing a second drive-in step using a second rapid thermal anneal at a second temperature lower than the first temperature. In this manner, the heavily doped source/drain regions for the PMOS device need not be subjected to the first temperature, however, the lightly doped source/drain regions for the PMOS device are still subjected to the first temperature.

Accordingly, a need exists for an improved method of making N-channel and P-channel devices in which the diffusion of the P-type dopant, such as boron, is reduced with respect to the N-type dopant.

SUMMARY OF THE INVENTION

A feature of the present invention is to provide N-channel and P-channel devices using separate drive-in steps.

In accordance with the invention, a method of making N-channel and P-channel devices using separate drive-in steps includes providing a semiconductor substrate with first and second active regions, introducing a first dopant into the first active region to provide all doping for a source and a drain in the first active region, driving-in the first dopant to form the source and the drain in the first active region, introducing a second dopant into the second active region to provide all doping for a source and a drain in the second active region after driving-in the first dopant, and driving-in the second dopant to form the source and the drain in the second active region. Preferably, the first dopant is arsenic or phosphorus, the second dopant is boron, and the first temperature exceeds the second temperature by at least 50° C. In this manner, the boron need not be subjected to the higher first temperature, thereby reducing boron diffusion.

Introducing the first dopant may include both light and heavy doses of the first dopant, and introducing the second dopant may include both light and heavy doses of the second dopant. Furthermore, first and second gates formed over the first and second active regions, respectively, can be formed simultaneously or in sequence.

A first embodiment of the method includes forming the first gate over the first active region, implanting a light dose of the first dopant into the first active region outside the first gate, forming spacers adjacent to opposing sidewalls of the first gate, implanting a heavy dose of the first dopant into the first active region, driving-in the first dopant using a first rapid thermal anneal at the first temperature, and then forming the second gate over the second active region, implanting a light dose of the second dopant into the second active region outside the second gate, forming spacers adjacent to opposing sidewalls of the second gate, implanting a heavy dose of the second dopant into the second active region, and driving-in the second dopant using a second rapid thermal anneal at the second temperature.

A second embodiment of the method includes simultaneously forming the first and second gates, implanting a light dose of the first dopant into the first active region outside the first gate, forming first spacers adjacent to the first gate and second spacers adjacent to the second gate, implanting a heavy dose of the first dopant into the first active region, driving-in the first dopant using a first rapid thermal anneal at the first temperature, and then implanting a heavy dose of the second dopant into the second active region outside the second gate and the second spacers, removing the second spacers, implanting a light dose of the second dopant into the second active region outside the second gate, and driving-in the second dopant using a second rapid thermal anneal at the second temperature.

Advantageously, N-channel and P-channel devices can be fabricated such that all N-type source/drain doping is driven-in at the first (higher) temperature before implanting any P-type source/drain doping, which is subsequently implanted and driven-in at the second (lower) temperature. Thus, the P-type source/drain doping need be subjected to the first temperature.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which:

FIGS. 2A–2I show cross-sectional views of successive process steps for making N-channel and P-channel devices using separate drive-in steps in accordance with a second embodiment of the invention.

DETAILED DESCRIPTION OF THE PREFERRED EMBODIMENTS

Figure 1A:
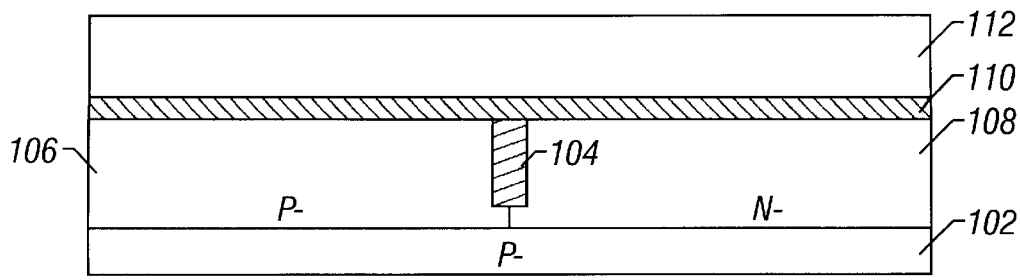
FIGS. 1A–1N show cross-sectional views of successive process steps for making N-channel and P-channel devices using separate drive-in steps in accordance with a first embodiment of the invention.

In the drawings, depicted elements are not necessarily drawn to scale and like or similar elements may be designated by the same reference numeral throughout the several views.

Figure 1B:
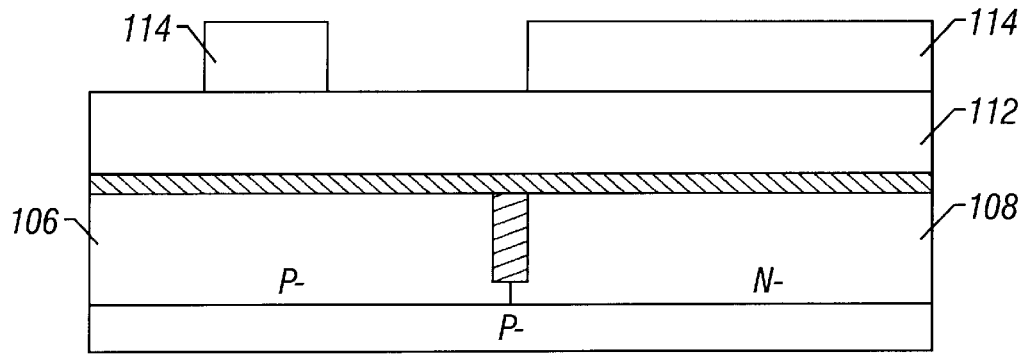
Figure 1C:
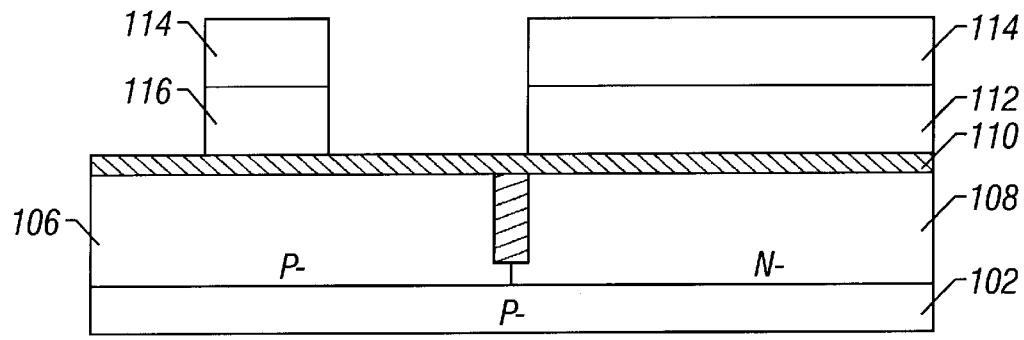
Figure 1D:
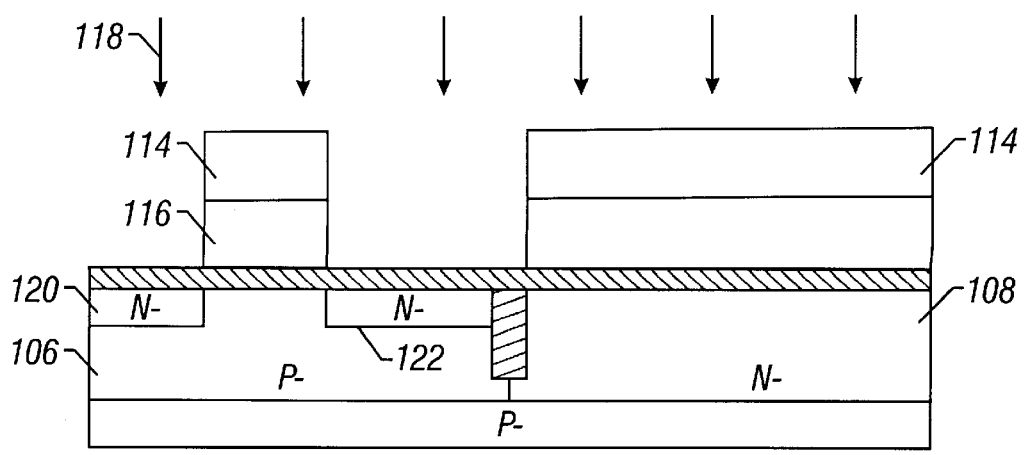
Figure 1E:
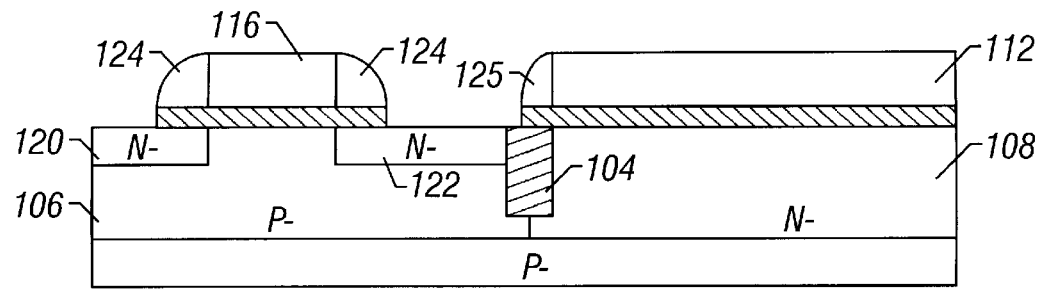
Figure 1F:
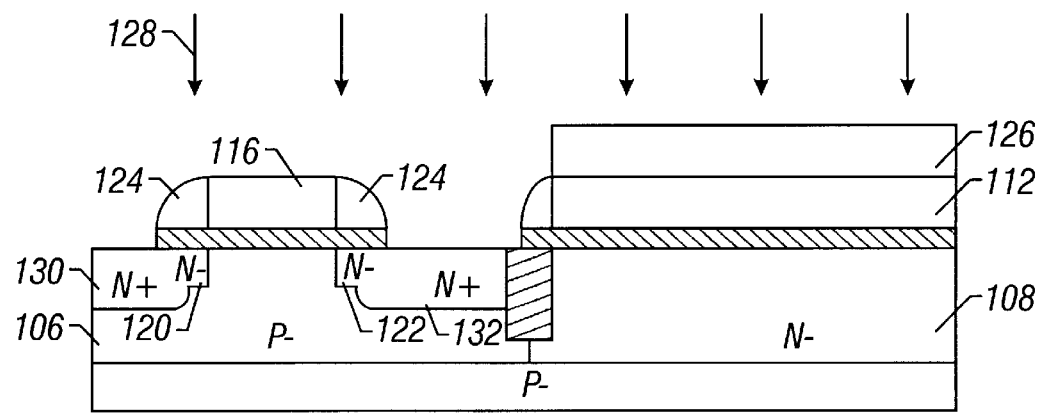
Figure 1G:
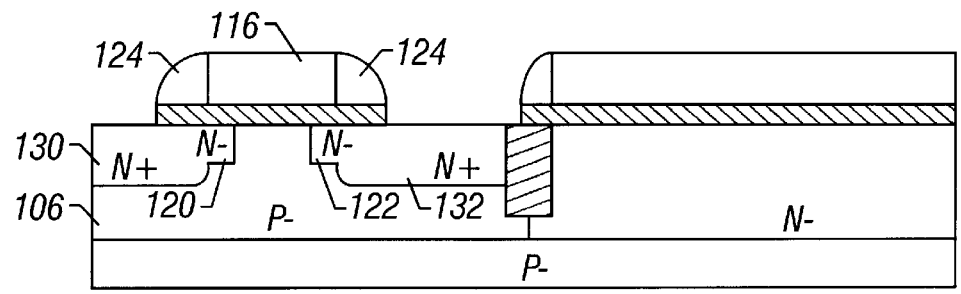
Figure 1H:
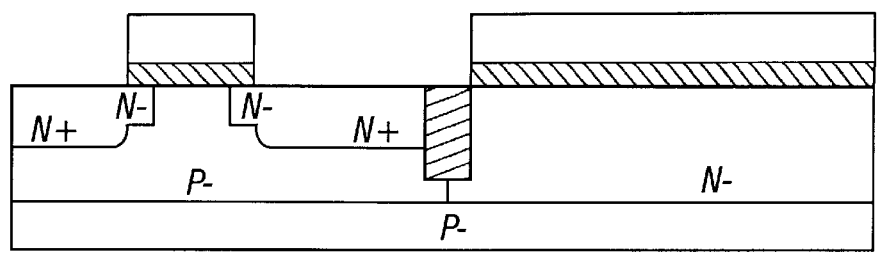
Figure 1I:
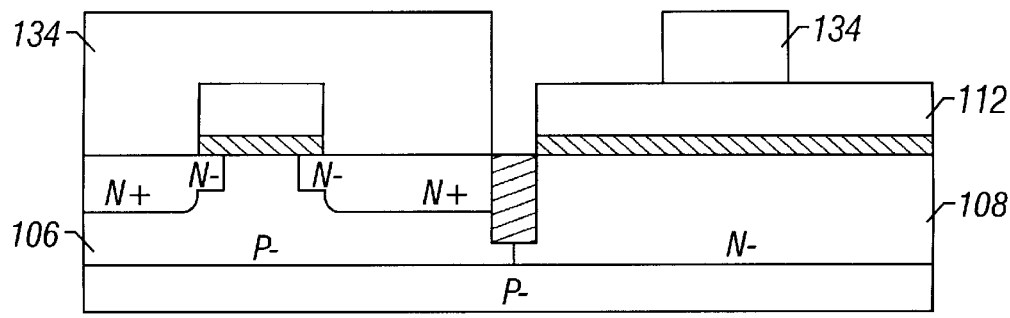
Figure 1J:
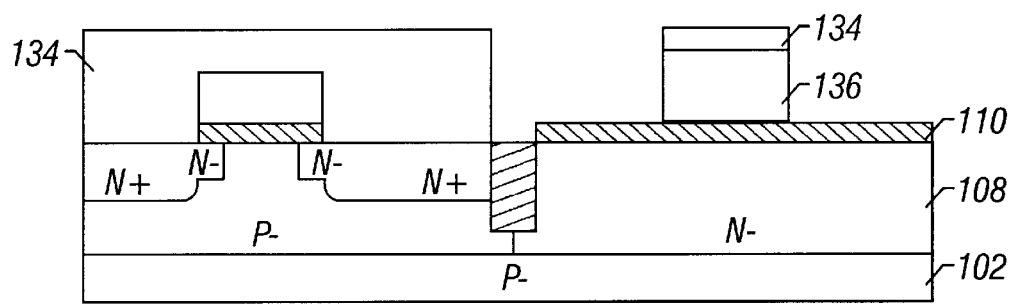
Figure 1K:
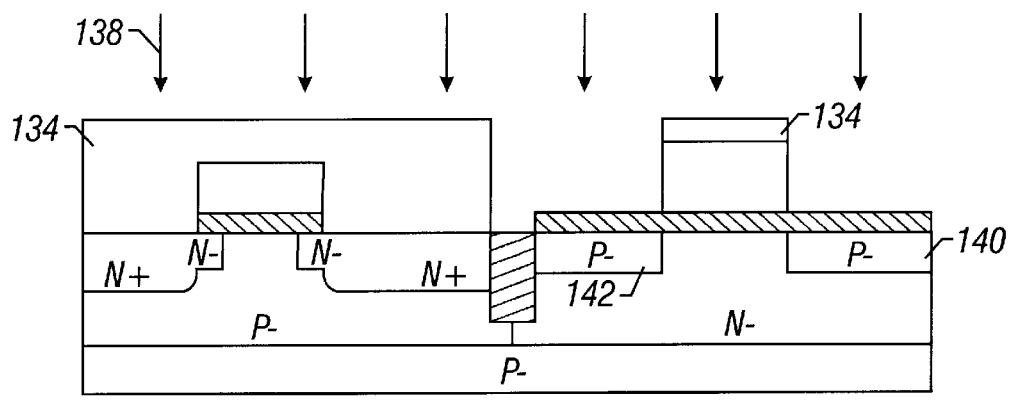
Figure 1L:
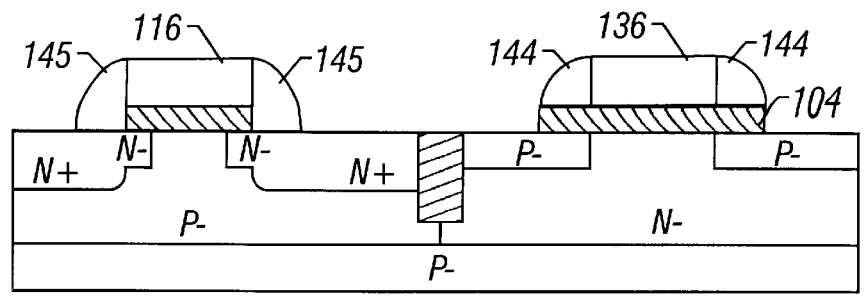
Figure 1M:
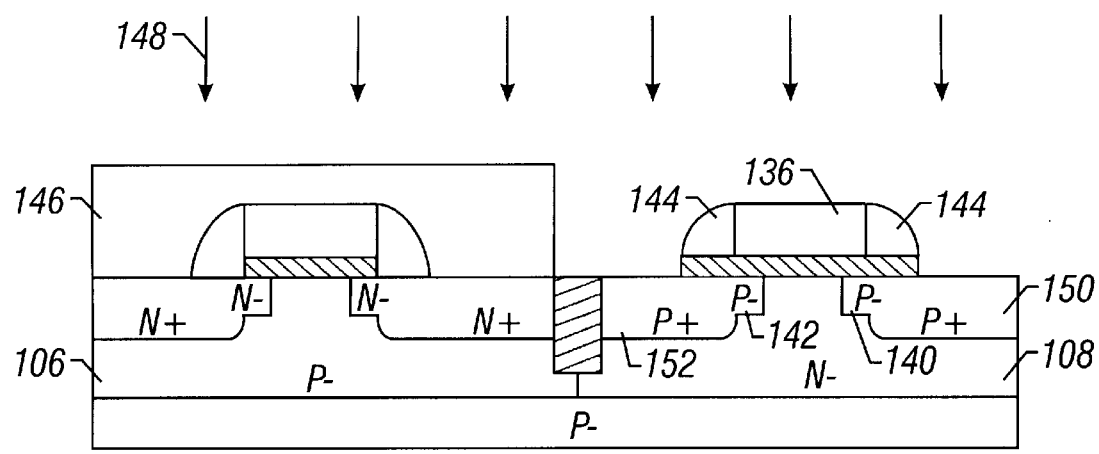
Figure 1N:
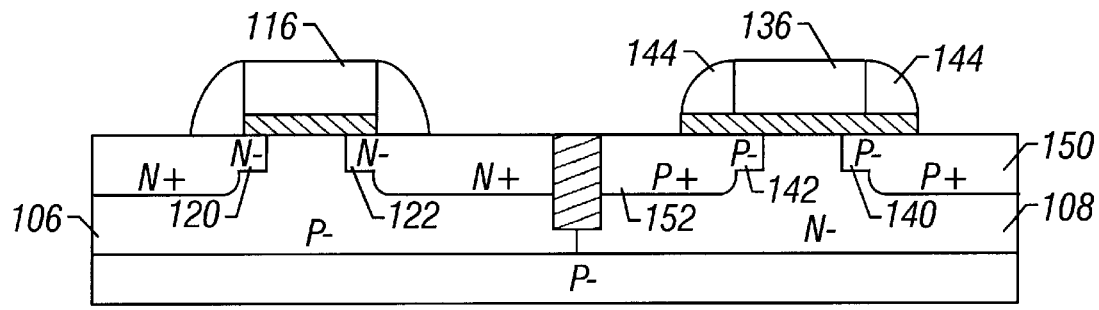

FIGS. 1A–1N show cross-sectional views of successive process steps for making N-channel and P-channel devices using separate drive-in steps in accordance with a first embodiment of the invention.

In FIG. 1A, silicon substrate 102 suitable for integrated circuit manufacture includes a P-type epitaxial surface layer disposed on a P+base layer (not shown). Substrate 102 contains trench oxide 104 that provides dielectric isolation between P-type NMOS region 106 and N-type PMOS region 108 in the epitaxial surface layer. NMOS region 106 has a boron concentration on the order of $1 \times 101^{15}$ atoms/cm$^3$, a <100> orientation and a resistivity of 12 ohm-cm. PMOS region 108 has an arsenic concentration on the order of $1 \times 10^{15}$ atoms/cm$^3$, a <100> orientation and a resistivity of 12 ohm-cm. A blanket layer of gate oxide 110, composed of silicon dioxide, is formed on the top surface of substrate 102 using tube growth at a temperature of 700 to 1000° C. in an $O_2$ containing ambient. Gate oxide 110 has a thickness in the range of 30 to 150 angstroms. Thereafter, a blanket layer of undoped polysilicon 112 is deposited by low pressure chemical vapor deposition (LPCVD) on the top surface of gate oxide 110. Polysilicon 112 has a thickness of 2000 angstroms. If desired, polysilicon 112 can be doped in situ as deposition occurs, or doped before a subsequent etch step by implanting arsenic with a dosage in the range of $1 \times 10^{15}$ to $5 \times 10^{15}$ atoms/cm$^2$ and an energy in the range of 2 to 80 kiloelectron-volts. However, it is generally preferred that polysilicon 112 be doped during later processing steps.

In FIG. 1B, photoresist 114 is deposited on polysilicon 112 and patterned to provide an opening that selectively exposes a first portion of polysilicon 112 over NMOS region 106 while covering the entire PMOS region 108. Photoresist 114 is selectively irradiated using a photolithographic system, such as a step and repeat optical projection system, in which deep ultraviolet light from a mercury-vapor lamp is projected through a first reticle and a focusing lens to obtain a first image pattern. Thereafter, photoresist 114 is developed and the irradiated portion is removed to provide the opening in photoresist 114.

In FIG. 1C, an anisotropic dry etch is applied that removes the first portion of polysilicon 112 exposed by the opening in photoresist 114. The etch is highly selective of polysilicon 112 and non-selective of gate oxide 110 so that only a negligible amount of gate oxide 110 is removed and substrate 102 is unaffected. The etch forms first gate 116 with substantially vertical opposing sidewalls over NMOS region 106. Thus, first gate 116 is the portion of polysilicon 112 over NMOS region 106 that photoresist 114 protects from the etch.

In FIG. 1D, lightly doped source and drain regions are implanted into NMOS region 106 by subjecting the structure to ion implantation of arsenic, indicated by arrows 118, at a dose in the range of $1\times10^{13}$ to $5\times10^{14}$ atoms/cm$^2$ and an energy in the range of 2 to 80 kiloelectron-volts. Photoresist 114 provides an implant mask for PMOS region 108 and the portion of NMOS region 106 underlying first gate 116. As a result, lightly doped source/drain regions 120 and 122 are implanted into portions of NMOS region 106 adjacent to and outside first gate 116. Lightly doped source/drain regions 120 and 122 are doped N− with an arsenic concentration in the range of about $1\times10^{17}$ to $1\times10^{18}$ atoms/cm$^3$ and a junction depth in the range of 100 to 1500 angstroms.

In FIG. 1E, photoresist 114 is stripped, and a layer of oxide with a thickness in the range of 600 to 2000 angstroms is conformally deposited over the exposed surfaces by CVD at a temperature in the range of 300 to 400° C. Thereafter, the structure is subjected to a reactive ion etch that forms first spacers 124 over NMOS region 106 and adjacent to the opposing sidewalls of first gate 116, and intermediate spacer 125 on trench oxide 104 and adjacent to polysilicon 112 over PMOS region 108. Spacers 124 cover portions of lightly doped source/drain regions 120 and 122. The reactive ion etch also removes the regions of gate oxide 110 above NMOS region 106 outside gate 116 and spacers 124.

In FIG. 1F, photoresist 126 is deposited over the structure, irradiated with a second image pattern projected through a second reticle using the step and repeat system, and then developed to include an opening that selectively exposes the entire NMOS region 106 while covering the entire PMOS region 108. Heavily doped source and drain regions are then implanted into NMOS region 106 by subjecting the structure to ion implantation of arsenic, indicated by arrows 128, at a dose in the range of $1\times10^{15}$ to $5\times10^{15}$ atoms/cm$^2$ and an energy in the range of 2 to 80 kiloelectron-volts. Photoresist 126 provides an implant mask for PMOS region 108, and first gate 116 and spacers 124 provide an implant mask for the underlying portion of NMOS region 106. As a result, heavily doped source/drain regions 130 and 132 are implanted into portions of NMOS region 106 adjacent to and outside spacers 124. Heavily doped source/drain regions 130 and 132 are doped N+ with an arsenic concentration in the range of about $1\times10^{18}$ to $1\times10^{20}$ atoms/cm$^3$ and a junction depth in the range of 200 to 3000 angstroms. Preferably, the junction depth of heavily doped source/drain regions 130 and 132 exceeds that of lightly doped source/drain regions 120 and 122.

In FIG. 1G, photoresist 126 is stripped, and a first rapid thermal anneal on the order of 1050° C. for 10 to 60 seconds is applied to remove crystalline damage and to drive-in and activate the implanted arsenic. As a result, source regions 120 and 130 form a source, and drain regions 122 and 132 form a drain for an NMOS device in NMOS region 106. Since the arsenic diffuses both vertically and laterally, heavily doped source/drain regions 130 and 132 extend partially beneath spacers 124, and lightly doped source/drain regions 120 and 122 extend slightly beneath first gate 116. However, the channel junctions of lightly doped source/drain regions 120 and 122 are substantially aligned with the sidewalls of first gate 116. It is noted that during the first rapid thermal anneal, no P-type source/drain doping has been introduced into PMOS region 108.

In FIG. 1H, a dry etch is applied that removes spacers 124, spacer 125 and the underlying oxide.

In FIG. 1I, photoresist 134 is deposited on polysilicon 112 and patterned to provide an opening that selectively exposes a second portion of polysilicon 112 over PMOS region 108 while covering the entire NMOS region 106. Photoresist 134 is selectively irradiated by a third image pattern projected from a third reticle using the step and repeat system, and thereafter photoresist 134 is developed and the irradiated portion is removed to provide the opening in photoresist 134.

In FIG. 1J, an anisotropic dry etch is applied that removes the second portion of polysilicon 112 exposed by the opening in photoresist 134. The etch is highly selective of polysilicon 112 and non-selective of gate oxide 110 so that only a negligible amount of gate oxide 110 is removed and substrate 102 is unaffected. The etch forms second gate 136 with substantially opposing vertical sidewalls over PMOS region 108. Thus, second gate 136 is the portion of polysilicon 112 over PMOS region 108 that photoresist 134 protects from the etch.

In FIG. 1K, lightly doped source and drain regions are implanted into PMOS region 108 by subjecting the structure to ion implantation of boron, indicated by arrows 138, at a dose in the range of $1\times10^{13}$ to $5\times10^{14}$ atoms/cm$^2$ and an energy in the range of 2 to 80 kiloelectron-volts. Photoresist 134 provides an implant mask for NMOS region 106 and the portion of PMOS region 108 underlying second gate 136. As a result, lightly doped source/drain regions 140 and 142 are implanted in PMOS region 108 adjacent to and outside second gate 136. Lightly doped source/drain regions 140 and 142 are doped P— with a boron concentration in the range of about $1\times10^{17}$ to $1\times10^{18}$ atoms/cm$^3$ and a junction depth in the range of 100 to 1500 angstroms.

In FIG. 1L, photoresist 134 is stripped, and a layer of oxide with a thickness in the range of 600 to 2000 angstroms is conformally deposited over the exposed surfaces by CVD at a temperature in the range of 300 to 400° C. Thereafter, the structure is subjected to a reactive ion etch that forms second spacers 144 over PMOS region 108 and adjacent to the opposing sidewalls of second gate 136, and intermediate spacers 145 over NMOS region 106 and adjacent to opposing sidewalls of first gate 116. Spacers 144 cover portions of lightly doped source/drain regions 140 and 142. The reactive ion etch also removes the regions of gate oxide 110 above PMOS region 108 outside gate 136 and spacers 144.

In FIG. 1M, photoresist 146 is deposited over the structure, irradiated with a fourth image pattern projected through a fourth reticle using the step and repeat system, and then developed to include an opening that selectively exposes the entire PMOS region 108 while covering the entire NMOS region 106. Heavily doped source and drain regions are then implanted into PMOS region 108 by subjecting the structure to ion implantation of boron, indicated by arrows 148, at a dose in the range of $1\times10^{15}$ to $5\times10^{15}$ atoms/cm$^2$ and an energy in the range of 2 to 80 kiloelectron-volts. Photoresist 146 provides an implant mask for NMOS region 106, and second gate 136 and spacers 144 provide an implant mask for the underlying portion of PMOS region 108. As a result, heavily doped source/drain regions 150 and 152 are implanted in PMOS region 108 adjacent to and outside of spacers 144. Heavily doped source/drain regions 150 and 152 are doped P+ with a boron concentration in the range of about $1\times10^{18}$ to $1\times10^{20}$ atoms/cm$^3$ and a junction depth in the range of 200 to 3000 angstroms. Preferably, the junction depth of heavily doped source/drain regions 150 and 152 exceeds that of lightly doped source/drain regions 140 and 142.

In FIG. 1N, photoresist 146 is stripped, and a second rapid thermal anneal on the order of 950° C. for 10 to 60 seconds is applied to remove crystalline damage and to drive-in and activate the implanted boron. As a result, source regions 140 and 150 form a source, and drain regions 142 and 152 form a drain for a PMOS device in PMOS region 108. Since the boron diffuses both vertically and laterally, heavily doped source/drain regions 150 and 152 extend partially beneath spacers 144, and lightly doped source/drain regions 140 and 142 extend slightly beneath second gate 136. However, the channel junctions of lightly doped source/drain regions 140 and 142 are substantially aligned with the sidewalls of second gate 136. Furthermore, since only a negligible amount of arsenic diffusion occurs during the second rapid thermal anneal, the channel junctions of lightly doped source/drain regions 120 and 122 remain substantially aligned with the sidewalls of first gate 116. It is noted that the temperature (950° C.) of the second rapid thermal anneal is 100° C. less than the temperature (1050° C.) of the first rapid thermal anneal, and that all of the boron source/drain doping in PMOS region 108 is introduced after the first rapid thermal anneal. As a result, the difference between the boron diffusion and the arsenic diffusion is dramatically reduced with respect to conventional techniques in which at least some of the boron source/drain doping is subjected to the thermal cycle that drives-in the arsenic (or other N-type dopant) source/drain doping.

FIGS. 2A–2I show cross-sectional views of successive process steps for making N-channel and P-channel devices using separate drive-in steps in accordance with a second embodiment of the invention. The primary difference between the first embodiment and the second embodiment is that in the first embodiment, the gates are formed in sequence, whereas in the second embodiment, the gates are formed simultaneously. Unless otherwise noted, the elements for the second embodiment (substrate 202, trench oxide 204, etc.) are similar to elements of the first embodiment (substrate 102, trench oxide 104, etc.), and the description of related elements and process steps need not be repeated.

Figure 2A:
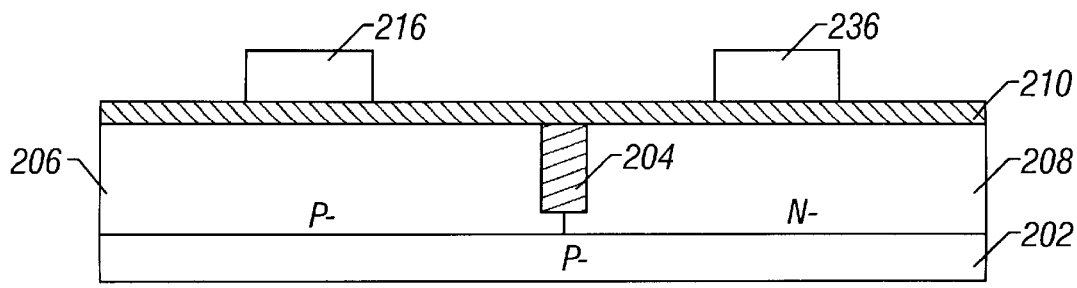

In FIG. 2A, silicon substrate 202 suitable for integrated circuit manufacture contains trench oxide 204 that provides dielectric isolation between P—type NMOS region 206 and N-type PMOS region 208. Gate oxide 210 is formed on the top surface of substrate 202. Thereafter, a blanket layer of polysilicon (not shown) is deposited on gate oxide 210, photoresist (not shown) is deposited on the polysilicon, the photoresist is irradiated with a first image pattern projected through a first reticle using a step and repeat system, the irradiated regions of the photoresist are removed to selectively expose the polysilicon, and an anisotropic dry etch is applied to etch portions of the polysilicon exposed through openings in the photoresist. The etch simultaneously forms first gate 216 over NMOS region 206 and second gate 236 over PMOS region 208. Thus, first gate 216 and second gate 236 are portions of the polysilicon over NMOS region 206 and PMOS region 208, respectively, that the photoresist protects from the etch.

Figure 2B:
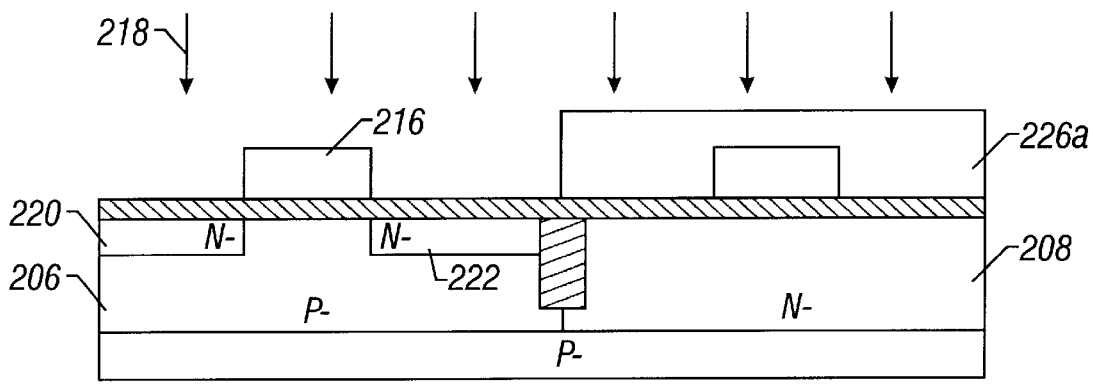

In FIG. 2B, photoresist 226a is deposited over the structure, irradiated with a second image pattern projected through a second reticle using the step and repeat system, and then developed to include an opening that selectively exposes the entire NMOS region 206 while covering the entire PMOS region 208. Thereafter, the structure is subjected to ion implantation of a light dose of arsenic, indicated by arrows 218, and lightly doped source and drain regions 220 and 222 are implanted into NMOS region 206 adjacent to and outside first gate 216 and are doped N−.

Figure 2C:
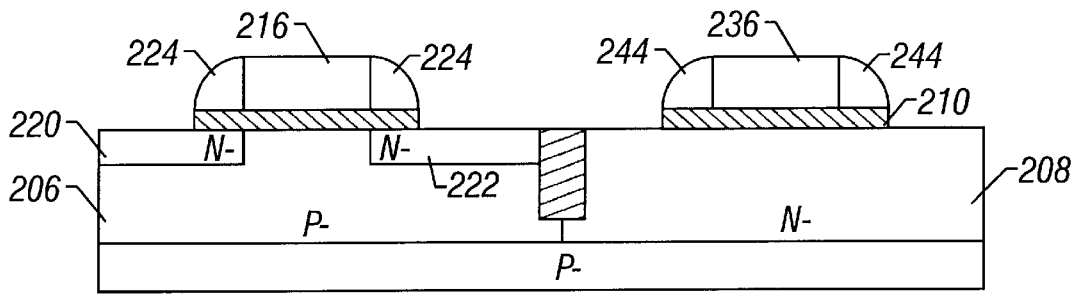

In FIG. 2C, photoresist 226a is stripped, and a layer of oxide with a thickness in the range of 600 to 2000 angstroms is conformally deposited over the exposed surfaces by CVD at a temperature in the range of 300 to 400° C. Thereafter, the structure is subjected to a reactive ion etch that forms first spacers 224 over NMOS region 206 and adjacent to the opposing sidewalls of first gate 216, and second spacers 244 over PMOS region 208 and adjacent to the opposing sidewalls of second gate 236. First spacers 224 cover portions of lightly doped source/drain regions 220 and 222. The reactive ion etch also removes the regions of gate oxide 210 outside first spacers 224 and second spacers 244.

Figure 2D:
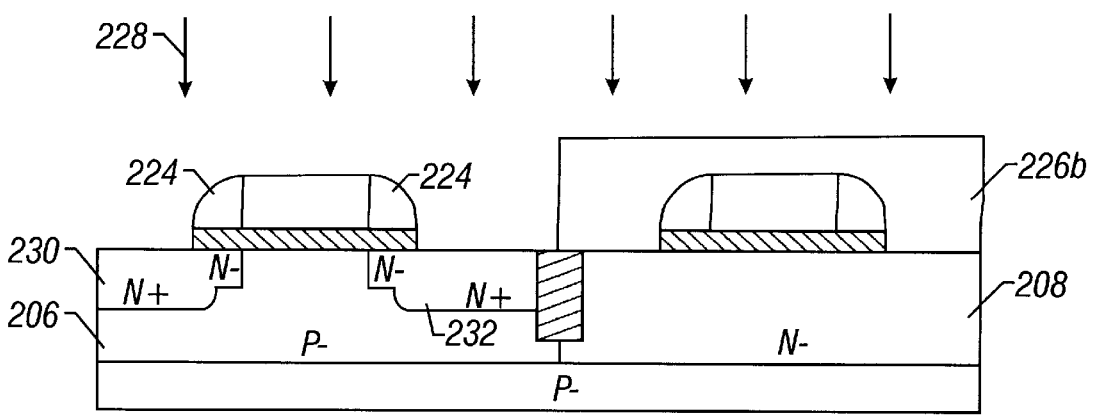

In FIG. 2D, photoresist 226b is deposited over the structure, irradiated with the second image pattern projected through the second reticle using the step and repeat system, and then developed to include an opening that selectively exposes the entire NMOS region 206 while covering the entire PMOS region 208. Thus, photoresist 226b is patterned in the same manner as photoresist 226a. Thereafter, the structure is subjected to ion implantation of a heavy dose of arsenic, indicated by arrows 228, and heavily doped source and drain regions 230 and 232 are implanted into NMOS region 206 adjacent to and outside first spacers 224 and are doped N+.

Figure 2E:
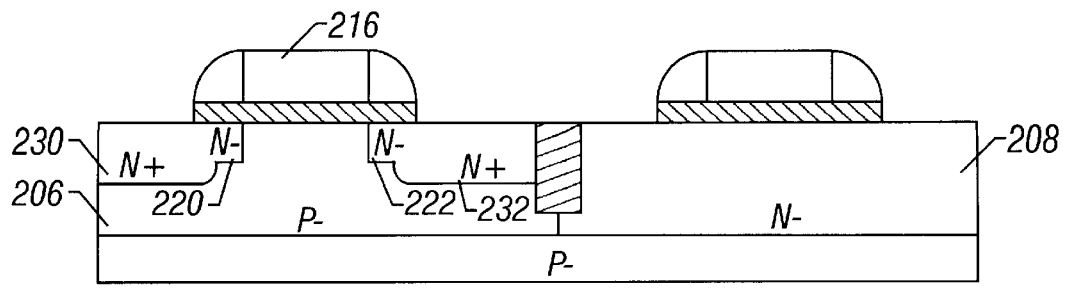

In FIG. 2E, photoresist 226b is stripped, and a first rapid thermal anneal on the order of 1050° C. for 10 to 60 seconds is applied to remove crystalline damage and to drive-in and activate the implanted arsenic. As a result, source regions 220 and 230 form a source, and drain regions 222 and 232 form a drain for an NMOS device in NMOS region 206. The channel junctions of lightly doped source/drain regions 220 and 222 are substantially aligned with the sidewalls of first gate 216. It is noted that during the first rapid thermal anneal, no P-type source/drain doping has been introduced into PMOS region 208.

Figure 2F:
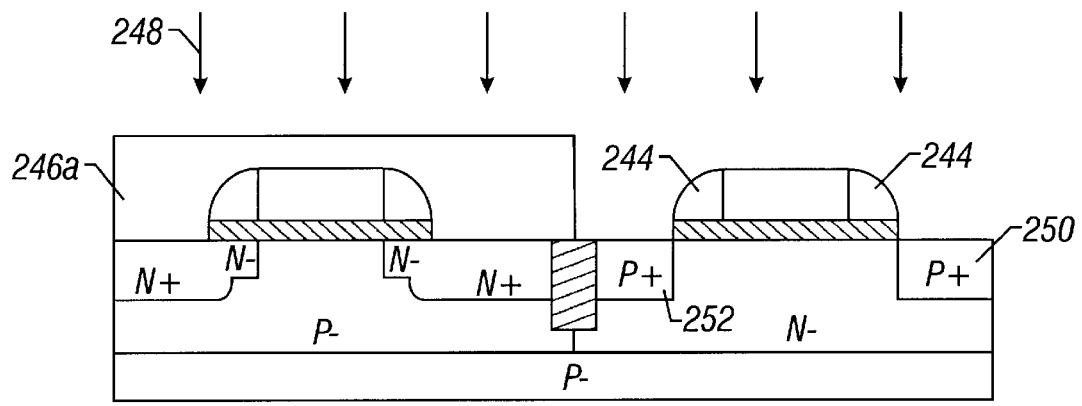

In FIG. 2F, photoresist 246a is deposited over the structure, irradiated with a third image pattern projected through a third reticle using the step and repeat system, and then developed to include an opening that selectively exposes the entire PMOS region 208 while covering the entire NMOS region 206. Thereafter, the structure is subjected to ion implantation of a heavy dose of boron, indicated by arrows 248, and heavily doped source and drain regions 250 and 252 are implanted into PMOS region 208 adjacent to and outside second spacers 244 and are doped P+.

Figure 2G:
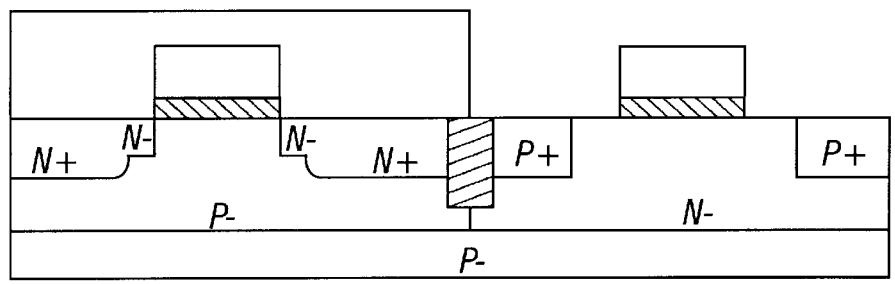

In FIG. 2G, photoresist 246a is stripped, and a dry etch is applied that removes first spacers 224, second spacers 244 and the underlying oxide.

Figure 2H:
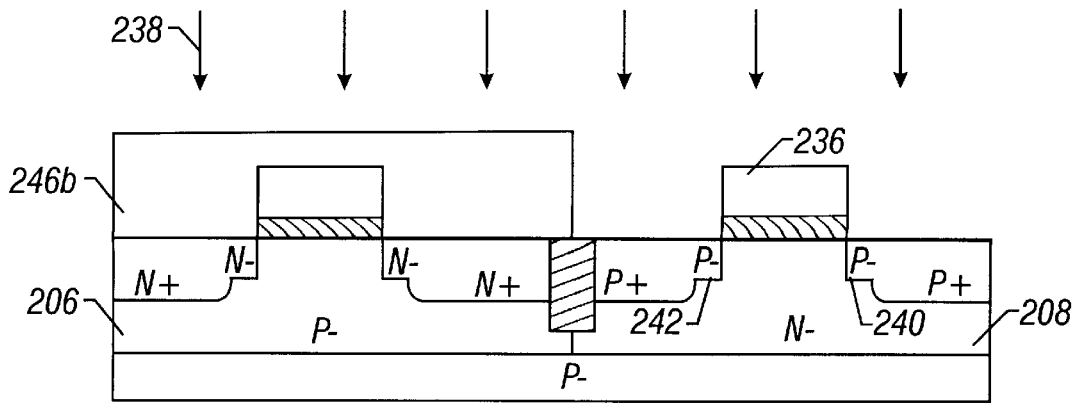
Figure 21:
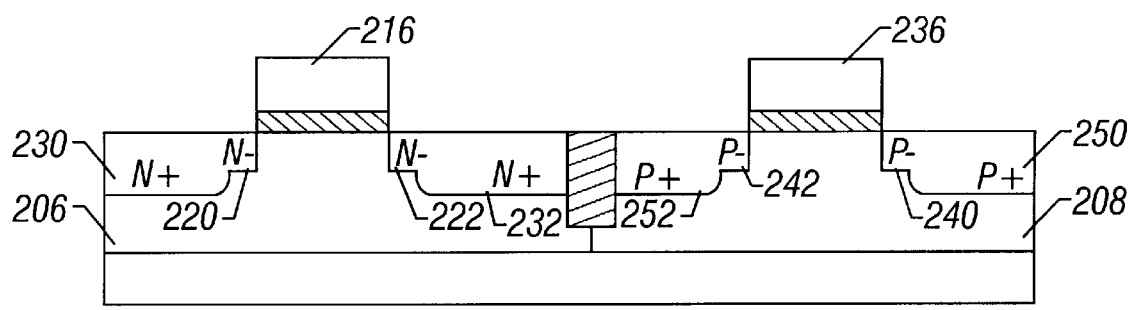

In FIG. 2H, photoresist 246b is deposited over the structure, irradiated with the third image pattern projected through the third reticle using the step and repeat system, and then developed to include an opening that selectively exposes the entire PMOS region 208 while covering the entire NMOS region 206. Thus, photoresist 246b is patterned in the same manner as photoresist 246a. Thereafter, the structure is subjected to ion implantation of a light dose of boron, indicated by arrows 238, and lightly doped source and drain regions 240 and 242 are implanted into PMOS region 208 adjacent to and outside second gate 238 and are doped P−.

In FIG. 2I, photoresist 246b is stripped, and a second rapid thermal anneal on the order of 950° C. for 10 to 60 seconds is applied to remove crystalline damage and to drive-in and activate the implanted boron. As a result, source regions 240 and 250 form a source, and drain regions 242 and 252 form a drain for a PMOS device in PMOS region 208. The channel junctions of lightly doped source/drain regions 240 and 242 are substantially aligned with the sidewalls of second gate 236, as are the channel junctions of lightly doped source/drain regions 220 and 222 with the sidewalls of first gate 216. Since the temperature (950° C.) of the second rapid thermal anneal is 100° C. less than the temperature (1050° C.) of the first rapid thermal anneal, and none of the boron source/drain doping in PMOS region 208 is subjected to the first temperature, the difference between the boron diffusion and the arsenic diffusion that would otherwise arise had some or all of the boron been subjected to the first temperature is dramatically reduced.

For illustration purposes, the NMOS and PMOS devices provide a CMOS inverter circuit, and their gates are coupled together. Gates 216 and 236 are formed simultaneously as a single strip of polysilicon. However, since gates 116 and 136 are formed in sequence using two separate photoresist layers, the potential exists for misalignment or displacement between the regions of the gates intended to contact one another. A sufficient misalignment or displacement may prevent gates 116 and 136 from electrically coupling to one another, thereby causing the CMOS inverter circuit to become defective. Various stitching techniques for coupling elements patterned by separate masks can be used.

Figure 3:
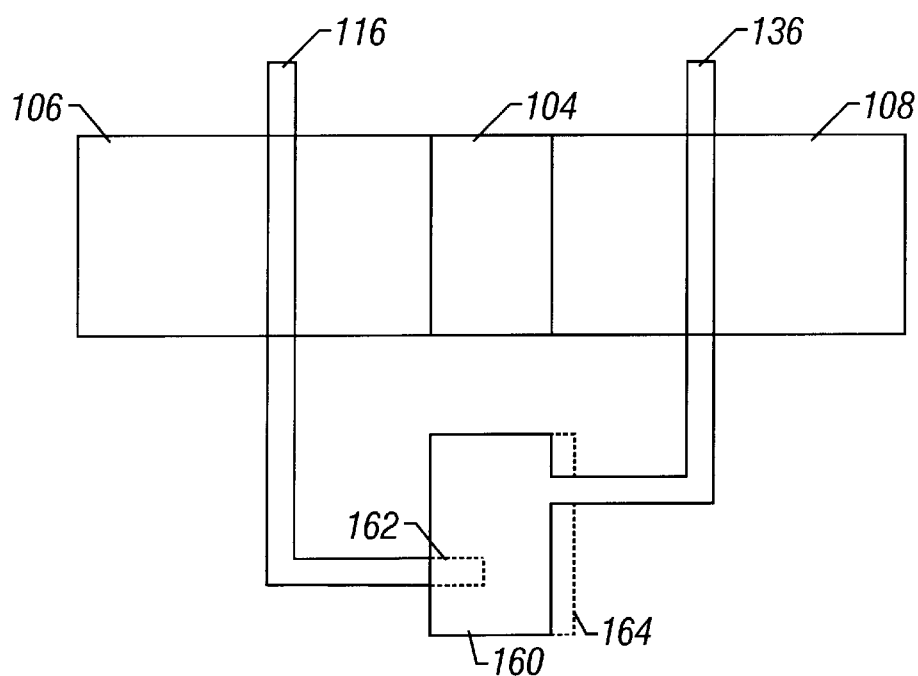
FIG. 3 shows a top plan view of a stitching technique for coupling the gates in the first embodiment.

FIG. 3 shows a top plan view of a stitching technique for electrically coupling gates 116 and 136. Gates 116 and 136 are shown above NMOS region 106 and PMOS region 108, respectively, with trench oxide 104 therebetween. For convenience of explanation, the spacers are not shown. Gate 116 is adjacent to contact region 160. Broken lines 162 depict a distal end of gate 116 that would be formed in the absence of contact region 160. As is seen, gate 136 is misaligned both vertically and laterally with respect to gate 116. However, contact region 160 compensates for this misalignment. Broken lines 164 depict a portion of contact region 160 that is present before gate 136 is formed. When polysilicon 112 is etched through the openings in photoresist 134 to form gate 136, the portion of contact region 160 depicted by broken lines 164 is removed. Nonetheless, gate 136 is coupled by the remaining portion of contact region 160 to gate 116 despite the misalignment. Further details regarding this stitching technique are disclosed in U.S. application Ser. No. 08/805,534 [docket no. M-3958 US], filed concurrently herewith, entitled "Method of Stitching Segments Defined by Adjacent Image Patterns During the Manufacture of a Semiconductor Device" by Jim Fulford, Jr. et al., which is incorporated herein by reference.

Further processing steps in the fabrication of IGFETs typically include forming a thick oxide layer over the active regions, forming contact windows in the oxide layer above the gate, source and drain, forming interconnect metallization in the contact windows, and forming a passivation layer over the metallization. In addition, subsequent high-temperature process steps can be used to supplement the desired anneal, activation, and drive-in functions, although it is highly preferred that any subsequent high-temperature processing not exceed the temperature of the second drive-in step. These further processing steps are conventional and need not be repeated herein. Likewise the principal processing steps disclosed herein may be combined with other steps apparent to those skilled in the art.

The present invention includes numerous variations to the embodiments described above. For instance, the gate can be various conductors, the gate insulator and can be various dielectrics, the N-type dopant can be arsenic, phosphorus and combinations thereof, and the P-type dopant can be boron, boron species (such as boron difluoride) and combinations thereof The NMOS and PMOS regions can be isolated using various techniques such as LOCOS oxidation. The dopants can be driven-in and activated using various combinations of heat and pressure. Furthermore, the LDDs are not essential.

The invention is particularly well-suited for fabricating N-channel and P-channel MOSFETs and other types of IGFETs, particularly for high-performance microprocessors where high circuit density is essential. Although only a single pair of N-channel and P-channel devices has been shown for purposes of illustration, it is understood that in actual practice, many devices are fabricated on a single semiconductor wafer as widely practiced in the art. Accordingly, the invention is well-suited for use in an integrated circuit chip, as well as an electronic system including a microprocessor, a memory and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A method of making N-channel and P-channel devices using separate drive-in steps, the method comprising:

providing a semiconductor substrate with first and second active regions;

forming a gate material over the first and second active regions;

removing a first portion of the gate material to form a first gate over the first active region;

introducing a first dopant into the first active region to provide doping for a source and a drain in the first active region, wherein the source and the drain are formed with lightly doped and heavily doped portions;

driving-in the first dopant to form the source and the drain in the first active region;

removing a second portion of the gate material to form a second gate over the second active region;

introducing a second dopant into the second active region to provide doping for a source and a drain in the second active region after driving-in the first dopant; and driving-in the second dopant to form the source and the drain in the second active region, wherein only the first dopant is introduced into the first active region, and wherein only the second dopant is introduced into the second active region.

2. The method of claim 1, including:

driving-in the first dopant at a first temperature; and driving-in the second dopant at a second temperature, wherein the first temperature is substantially greater than the second temperature.

3. The method of claim 2, wherein the first temperature exceeds the second temperature by at least 50° C.

4. The method of claim 2, wherein at the second temperature the second dopant diffuses into the substrate at a substantially greater rate than the first dopant.

5. The method of claim 2, wherein the first dopant is selected from the group consisting of arsenic, phosphorus, and combinations thereof, and the second dopant is selected from the group consisting of boron, boron species and combinations thereof.

6. The method of claim 1 wherein the N-channel and P-channel devices provide a CMOS inverter circuit.

7. The method of claim 1, wherein introducing the first dopant includes:

implanting a light dose of an N-type dopant into portions of the first active region to provide lightly doped source and drain regions that are aligned with opposing sidewalls of a first gate; and then implanting a heavy dose of an N-type dopant into portions of the first active region to provide heavily doped source and drain regions that are aligned with first spacers formed adjacent to the opposing sidewalls of the first gate.

8. The method of claim 1, wherein introducing the second dopant includes:

implanting a light dose of a P-type dopant into portions of the second active region to provide lightly doped source and drain regions that are aligned with opposing sidewalls of the second gate; and then implanting a heavy dose of a P-type dopant into portions of the second active region to provide heavily doped source and drain regions that are aligned with second spacers formed adjacent to the opposing sidewalls of the second gate.

9. The method of claim 1, wherein:

introducing the first dopant includes implanting a light dose of an N-type dopant into portions of the first active region to provide lightly doped source and drain regions that are aligned with opposing sidewalls of the first gate, and implanting a heavy dose of an N-type dopant into portions of the first active region to provide heavily doped source and drain regions that are aligned with first spacers formed adjacent to the opposing sidewalls of the first gate;

driving-in the first dopant merges the lightly doped and heavily doped source and drain regions in the first active region to form the source and the drain in the first active region;

introducing the second dopant includes implanting a light dose of a P-type dopant into portions of the second active region to provide lightly doped source and drain regions that are aligned with opposing sidewalls of the second gate, and implanting a heavy dose of a P-type dopant into portions of the second active region to provide heavily doped source and drain regions that are aligned with second spacers formed adjacent to the opposing sidewalls of the second gate; and driving-in the second dopant merges the lightly doped and heavily doped source and drain regions in the second active region to form the source and the drain in the second active region.

10. A method of making N-channel and P-channel devices using separate drive-in steps, the method comprising:

providing a semiconductor substrate with first and second active regions, wherein the first active region is doped a first conductivity type and the second active region is doped a second conductivity type;

forming a gate insulator on the first and second active regions;

forming a gate material on the gate insulator;

etching the gate material to form a first gate over the first active region;

introducing a dopant of second conductivity type into the first active region to provide doping for a source and a drain in the first active region, wherein the source and the drain are formed with lightly doped and heavily doped portions;

driving-in the dopant of second conductivity type at a first temperature to form the source and the drain in the first active region; then etching the gate material to form a second gate over the second active region;

introducing a dopant of first conductivity type into the second active region to provide doping for a source and a drain in the second active region; and driving-in the dopant of first conductivity type at a second temperature to form the source and the drain in the second active region, wherein the first temperature exceeds the second temperature by at least 50° C. wherein only the dopant of the second conductivity type is introduced into the first active region to form the source and drain regions therein, and wherein only the dopant of the first conductivity type is introduced into the second active regions to form the source and drains therein.

11. The method of claim 10, wherein:

the N-channel device is formed in the first active region;

the P-channel device is formed in the second active region;

the dopant of first conductivity type is selected from the group consisting of arsenic, phosphorus, and combinations thereof; and the dopant of second conductivity type is selected from the group consisting of boron, boron species and combinations thereof.

12. The method of claim 10, wherein:

introducing the dopant of second conductivity type includes implanting a light dose of an N-type dopant into the first active region and then implanting a heavy dose of an N-type dopant into the first active region; and introducing the dopant of first conductivity type includes implanting a light dose of a P-type dopant into the second active region and then implanting a heavy dose of a P-type dopant into the second active region.

13. The method of claim 10, wherein the first and second temperatures are in the range of about 950 to 1050° C.

14. The method of claim 10, wherein:

driving-in the dopant of second conductivity type includes applying a first rapid thermal anneal; and driving-in the dopant of second conductivity type includes applying a second rapid thermal anneal.

15. A method of making NMOS and PMOS devices using separate drive-in steps, the method comprising:

providing a semiconductor substrate with NMOS and PMOS regions adjacent to an isolation region in the substrate;

forming a gate oxide on the NMOS and PMOS regions;

forming a polysilicon layer on the gate oxide;

etching a first portion of the polysilicon layer to form a first gate over the NMOS region;

etching a second portion of the polysilicon layer to form a second gate over the PMOS region;

implanting an N-type dopant into the NMOS region outside the first gate to provide source/drain doping in the NMOS region, the source/drain doping providing lightly doped source/drain portions and heavily doped source/drain portions;

driving-in the N-type dopant by applying a first rapid thermal anneal at a first temperature to form an N-type source and an N-type drain in the NMOS region;

implanting a P-type dopant into the PMOS region outside the second gate to provide source/drain doping in the PMOS region after driving-in the N-type dopant; and driving-in the P-type dopant by applying a second rapid thermal anneal at a second temperature to form a P-type source and a P-type drain in the PMOS region, wherein the first temperature exceeds the second temperature by at least 50° C., wherein only the N-type dopant is implanted in the NMOS region to provide the source/drain doping therein, and only the P-type dopant is implanted in the PMOS to provide the source/drain doping.

16. The method of claim 15, wherein the N-type dopant is selected from the group consisting of arsenic, phosphorus, and combinations thereof, and the P-type dopant is selected from the group consisting of boron, boron species and combinations thereof.

17. The method of claim 15, wherein the first and second temperatures are in the range of about 950 to 1050° C.

18. The method of claim 15, including simultaneously etching the first and second portions of the polysilicon layer.

19. The method of claim 15, including sequentially etching the first and second portions of the polysilicon layer.

20. The method of claim 18, including simultaneously forming first spacers adjacent to opposing sidewalls of the first gate and second spacers adjacent to opposing sidewalls of the second gate.

21. The method of claim 19, including forming first spacers adjacent to opposing sidewalls of the first gate and then forming second spacers adjacent to opposing sidewalls of the second gate.

22. The method of claim 15, wherein:
  implanting the N-type dopant includes implanting a light dose of a first N-type dopant into the NMOS region outside the first gate and then implanting a heavy dose of a second N-type dopant into the NMOS region outside the first gate and first spacers adjacent to opposing sidewalls of the first gate; and
  implanting the P-type dopant includes implanting a light dose of a first P-type dopant into the PMOS region outside the second gate and then implanting a heavy dose of a second P-type dopant into the PMOS region outside the second gate and second spacers adjacent to opposing sidewalls of the second gate.

23. The method of claim 15, including the following steps in the sequence set forth:
  forming a first photoresist layer over the substrate with an opening that selectively exposes the first portion of the polysilicon layer;
  etching the first portion of the polysilicon layer through the opening in the first photoresist layer to form the first gate;
  implanting a light dose of a first N-type dopant through the opening in the first photoresist layer into the NMOS region outside the first gate to provide lightly doped source and drain regions in the NMOS region;
  stripping the first photoresist layer;
  forming first spacers adjacent to opposing sidewalls of the first gate;
  forming a second photoresist layer over the substrate with an opening that selectively exposes the NMOS region;
  implanting a heavy dose of a second N-type dopant through the opening in the second photoresist layer into the NMOS region outside the first gate and the first spacers to provide heavily doped source and drain regions in the NMOS region;
  stripping the second photoresist layer;
  driving-in the first and second N-type dopants so that the lightly doped and heavily doped source regions in the NMOS region provide the N-type source, and the lightly doped and heavily doped drain regions in the NMOS region provide the N-type drain;
  forming a third photoresist layer over the substrate with an opening that selectively exposes the second portion of the polysilicon layer;
  etching the second portion of the polysilicon layer through the opening in the third photoresist layer to form the second gate;
  implanting a light dose of a first P-type dopant through the opening in the third photoresist layer into the PMOS region outside the second gate to provide lightly doped source and drain regions in the PMOS region;
  stripping the third photoresist layer;
  forming second spacers adjacent to opposing sidewalls of the second gate;
  forming a fourth photoresist layer over the substrate with an opening that selectively exposes the PMOS region;
  implanting a heavy dose of a second P-type dopant through the opening in the fourth photoresist layer into the PMOS region outside the second gate and the second spacers to provide heavily doped source and drain regions in the PMOS region;
  stripping the fourth photoresist layer; and
  driving-in the first and second P-type dopants so that the lightly doped and heavily doped source regions in the PMOS region provide the P-type source, and the lightly doped and heavily doped drain regions in the PMOS region provide the P-type drain.

24. The method of claim 15, including the following steps in the sequence set forth:
  simultaneously etching the first and second portions of the polysilicon layer to simultaneously form the first and second gates;
  forming a first photoresist layer over the substrate with an opening that selectively exposes the NMOS region;
  implanting a light dose of a first N-type dopant through the opening in the first photoresist layer into the NMOS region outside the first gate to provide lightly doped source and drain regions in the NMOS region;
  stripping the first photoresist layer;
  forming first spacers adjacent to opposing sidewalls of the first gate and second spacers adjacent to opposing sidewalls of the second gate;
  forming a second photoresist layer over the substrate with an opening that selectively exposes the NMOS region;
  implanting a heavy dose of a second N-type dopant through the opening in the second photoresist layer into the NMOS region outside the first gate and the first spacers to provide heavily doped source and drain regions in the NMOS region;
  stripping the second photoresist layer;
  driving-in the first and second N-type dopants so that the lightly doped and heavily doped source regions in the NMOS region provide the N-type source, and the lightly doped and heavily doped drain regions in the NMOS region provide the N-type drain;

forming a third photoresist layer over the substrate with an opening that selectively exposes the PMOS region;

implanting a heavy dose of a first P-type dopant through the opening in the third photoresist layer into the PMOS region outside the second gate and the second spacers to provide heavily doped source and drain regions in the PMOS region;

stripping the third photoresist layer;

removing the second spacers;

forming a fourth photoresist layer over the substrate with an opening that selectively exposes the PMOS region;

implanting a light dose of a second P-type dopant into the PMOS region outside the second gate to provide lightly doped source and drain regions in the PMOS region;

stripping the fourth photoresist layer; and driving-in the first and second P-type dopants so that the lightly doped and heavily doped source regions in the PMOS region provide the P-type source, and the lightly doped and heavily doped drain regions in the PMOS region provide the P-type drain.

* * * * *